US010670721B2

(12) United States Patent
Efimov

(10) Patent No.: US 10,670,721 B2
(45) Date of Patent: Jun. 2, 2020

(54) DUAL FREQUENCY FMCW LIDAR AND METHOD

(71) Applicant: HRL Laboratories, LLC, Malibu, CA (US)

(72) Inventor: Oleg M. Efimov, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 341 days.

(21) Appl. No.: 15/609,788

(22) Filed: May 31, 2017

(65) Prior Publication Data

US 2018/0210068 A1     Jul. 26, 2018

Related U.S. Application Data

(60) Provisional application No. 62/450,047, filed on Jan. 24, 2017.

(51) Int. Cl.
| | |
|---|---|
| *G01S 17/34* | (2020.01) |
| *G01S 17/58* | (2006.01) |
| *H04B 10/00* | (2013.01) |
| *G01R 31/28* | (2006.01) |
| *H04L 27/10* | (2006.01) |

(Continued)

(52) U.S. Cl.
CPC .......... *G01S 17/34* (2020.01); *G01R 31/2829* (2013.01); *G01S 7/4818* (2013.01); *G01S 7/4917* (2013.01); *G01S 17/58* (2013.01); *H04B 10/142* (2013.01); *H04L 27/103* (2013.01);

(Continued)

(58) Field of Classification Search
CPC ...... G01S 7/4917; G01S 17/95; G01S 17/325; G01S 7/4818; G01S 17/58; G01S 7/4811; G01P 13/045; G01N 21/63; G01N 21/47
See application file for complete search history.

(56) References Cited

U.S. PATENT DOCUMENTS 5,822,047 A * 10/1998 Contarino ............... G01S 7/484
356/5.01
7,106,447 B2   9/2006 Hays
(Continued)

FOREIGN PATENT DOCUMENTS

WO        2011-103480 A2      8/2011

OTHER PUBLICATIONS

U.S. Appl. No. 62/453,468, Efimov Oleg, filed Feb. 1, 2017.
(Continued)

*Primary Examiner* — Luke D Ratcliffe
(74) *Attorney, Agent, or Firm* — Ladas & Parry

(57) ABSTRACT

A lidar including a laser having a first frequency-modulated laser radiation and a second frequency-modulated laser radiation, a first waveguide coupled to the laser, wherein the first frequency-modulated laser radiation and the second frequency-modulated laser radiation are transmitted by the laser into the first waveguide, a second waveguide, a filter coupled between the first waveguide and the second waveguide, wherein the filter is configured to couple and pass the first frequency-modulated laser radiation through the filter to the second waveguide, and is configured to not couple or pass the second frequency-modulated laser radiation through the filter to the second waveguide, and a photodetector coupled to the second waveguide.

24 Claims, 4 Drawing Sheets

(51) Int. Cl.
  *H04L 27/144* (2006.01)
  *G01S 7/481* (2006.01)
  *G01S 7/4912* (2020.01)
  *G01R 35/00* (2006.01)

(52) U.S. Cl.
  CPC .......... *H04L 27/144* (2013.01); *G01R 35/005* (2013.01)

(56) References Cited

U.S. PATENT DOCUMENTS

| | | | |
|---|---|---|---|
| 8,908,160 B2 | 12/2014 | Dakin et al. | |
| 2003/0146826 A1 | 8/2003 | Viana et al. | |
| 2009/0297155 A1 | 12/2009 | Weiner et al. | |
| 2012/0194823 A1 | 8/2012 | Moore et al. | |
| 2015/0098082 A1* | 4/2015 | Wang | G01N 21/55 356/300 |
| 2016/0299228 A1* | 10/2016 | Maleki | G01S 17/325 |

OTHER PUBLICATIONS

S. Gao, R. Hui, "Frequency-modulated continuous-wave lidar using I/Q modulator for simplified heterodyne detection," Opt. Lett., v. 37, No. 11, p. 2022 (2012).

C. J. Karlsson, F.A. Olsson, "Linearization of the frequency sweep of a frequency-modulated continuous-wave semiconductor laser radar and the resulting ranging performance," Appl. Opt., v. 38, No. 15, p. 3376 (1999).

C. J. Karlsson, et al., "All-fiber multifunction continuous-wave coherent laser radar at 1.55 µm for range, speed, vibration, and wind measurements," Appl. Opt., v. 39. No. 21, p. 3716 (2000).

J.V. Hryniewicz, et al., "Higher Order Filter Response in Coupled Microring Resonators," IEEE J. Photonics Technology Letters, v. 12, No. 3, p. 320 (2000).

B.E. Little, et al., "Microring resonator channel dropping filters," J. Lightwave Technology, v. 15, No. 6, p. 998 (1997).

U.S. Appl. No. 15/648,274, Efimov, filed Jul. 12, 2017.

Derickson, "Fiber optic test and measurement," Prentice-Hall, Section 5.2.2, pp. 175-179 (1998).

Cezard, et al., "Performance evaluation of a dual fringe-imaging Michelson interferometer for air parameter measurements with a 355nm Rayleigh-Mie lidar," Applied Optics vol. 48, No. 12, pp. 2321-2332 (Apr. 20, 2009).

Fraczek et al., "Short-range optical air data measurements for aircraft control using rotational Raman backscatter," Optics Express, vol. 21, No. 14, pp. 16398-16414 (Jul. 15, 2013).

Tenti et al., "On the kinetic model description of Rayleigh-Brillouin scattering from molecular gases," Canadian Journal of Physics, vol. 52, pp. 285-290 (1974).

Witschas, "Analytical model for Rayleigh-Brillouin line shapes in air," Applied Optics, vol. 50, No. 3, pp. 267-270 (Jan. 20, 2011).

From U.S. Appl. No. 15/648,274 (unpublished), Application and Office Actions.

From PCT/US2017/035320, International Search Report and Written Opinion dated Oct. 20, 2017.

International Preliminary Report on Patentability from PCT/US2017/035320, dated Sep. 10, 2019.

International Preliminary Report on Patentability from PCT/US2017/035320, dated Dec. 2, 2019.

* cited by examiner

DUAL FREQUENCY FMCW LIDAR AND METHOD

CROSS REFERENCE TO RELATED APPLICATIONS

This application relates to and claims the benefit of priority from U.S. Provisional Patent Application 62/450,047, filed Jan. 24, 2017, which is incorporated herein by reference as though set forth in full.

TECHNICAL FIELD

This disclosure relates to Light Detection and Ranging (LIDAR), also known as lidar.

BACKGROUND

Frequency-modulated continuous-wave (FMCW) lidars allow remote measurements of range and velocity of objects. For the measurements it is necessary to displace from 0 Hz a beat signal developed by mixing a received signal and a reference signal. Usually, electronic or electro-optic modulators are used for this displacement. These modulators develop two frequency sidebands and do not allow defining the sign of Doppler shift, which is necessary for an unambiguous measurement of velocity. Only a direct frequency shifter can be used if velocity measurement is needed. Currently, only an acousto-optic modulator (AOM) is known to be used for this purpose. The main disadvantages of using an AOM are increased complexity and only a small available frequency shift as described in Reference [1] below, which is incorporated herein by reference. Also, an AOM may not be appropriate for integration into some applications.

The progress in semiconductor lasers in the last decade has resulted in development of small-sized high power lasers which can be directly used in integrated optical circuits. In addition, a linear frequency sweep of these lasers can be achieved simply by direct modulation of their currents.

Various frequency-modulation patterns can be used in lidar applications. The most common frequency-modulation patterns are a linear chirp modulation and a triangular frequency modulation. However, only a triangular frequency modulation, in which the frequency is swept up and down in frequency, allows discrimination of Doppler shift by calculation of a difference between the frequencies that correspond to the positive and negative slopes of the modulation. This is why triangular modulation is usually used if the velocity of an object needs to be measured, as described in References [2] and [3] below, which are incorporated herein by reference. The main disadvantages of the triangular frequency modulation is that it is necessary to use modulators to displace the beat frequency from 0 Hz, and the measurements of range and Doppler speed are erroneous in the cases of small range to the object and/or its high speed as is mentioned in Reference [3] below, which is incorporated herein by reference. Modulators increase the noise in the measurements, and the last circumstance can result in ambiguities concerning range and Doppler velocity.

An electro-optic inphase/quadrature (I/Q) modulator has been used to eliminate an acousto-optic frequency shifter, as described in Reference [1]. The main disadvantage of using an electro-optic inphase/quadrature (I/Q) modulator is the quite complex opto-electronics needed for both the transmitted and received beams, which considerably increases the noise in measurements.

REFERENCES

The following references are incorporated herein by reference as though set forth in full.
[1] S. Gao, R. Hui, "Frequency-modulated continuous-wave lidar using I/Q modulator for simplified heterodyne detection," Opt. Lett., v. 37, no. 11, p. 2022 (2012),
[2] C. J. Karlsson, F. A. Olsson, "Linearization of the frequency sweep of a frequency-modulated continuous-wave semiconductor laser radar and the resulting ranging performance," Appl. Opt., v. 38, no. 15, p. 3376 (1999),
[3] C. J. Karlsson, et al., "All-fiber multifunction continuous-wave coherent laser radar at 1.55 µm for range, speed, vibration, and wind measurements," Appl. Opt., v. 39, no. 21, p. 3716 (2000),
[4] J. V. Hryniewicz, et al., "Higher Order Filter Response in Coupled Microring Resonators," IEEE J. Photonics Technology Letters, v. 12, no. 3, p. 320 (2000), and
[5] B. E. Little, et al., "Microring resonator channel dropping filters," J. Lightwave Technology, v. 15, no. 6, p. 998 (1997).

What is needed is a method for measurement of object velocity that provides a large displacement of beat frequency from 0 Hz that doesn't require modulators, which add noise to the measurements. The embodiments of the present disclosure answer these and other needs.

SUMMARY

In a first embodiment disclosed herein, a lidar comprises a laser having a first frequency-modulated laser radiation and a second frequency-modulated laser radiation, a first waveguide coupled to the laser, wherein the first frequency-modulated laser radiation and the second frequency-modulated laser radiation are transmitted by the laser into the first waveguide, a second waveguide, a filter coupled between the first waveguide and the second waveguide, wherein the filter is configured to couple and pass the first frequency-modulated laser radiation through the filter to the second waveguide, and is configured to not couple or pass the second frequency-modulated laser radiation through the filter to the second waveguide, and a photodetector coupled to the second waveguide.

In another embodiment disclosed herein, a method of frequency-modulated continuous-wave (FMCW) detection of range and velocity of an object comprises transmission of a first frequency-modulated laser radiation from a laser and a second frequency-modulated laser radiation from the laser through a first waveguide, redirection by a filter of the first frequency-modulated laser radiation into a second waveguide, outcoupling the second frequency-modulated laser radiation from the first waveguide for exposure of an object, coupling a received waveform of scattered radiation from the object into the second waveguide, and mixing the received scattered radiation with the first frequency-modulated laser radiation.

In yet another embodiment disclosed herein, a lidar comprises a laser having a first frequency-modulated laser radiation and a second frequency-modulated laser radiation, a first waveguide coupled to the laser, wherein the first frequency-modulated laser radiation and the second frequency-modulated laser radiation are transmitted by the laser into the first waveguide, a second waveguide, a filter coupled between the first waveguide and the second waveguide, wherein the filter is configured to couple and pass the first frequency-modulated laser radiation through the filter to the second waveguide, and is configured to not couple or pass the second frequency-modulated laser radiation through the filter to the second waveguide, a third waveguide, and a photodetector coupled to the second waveguide and to the third waveguide.

These and other features and advantages will become further apparent from the detailed description and accompanying figures that follow. In the figures and description, numerals indicate the various features, like numerals referring to like features throughout both the drawings and the description.

DETAILED DESCRIPTION

Figure 1:
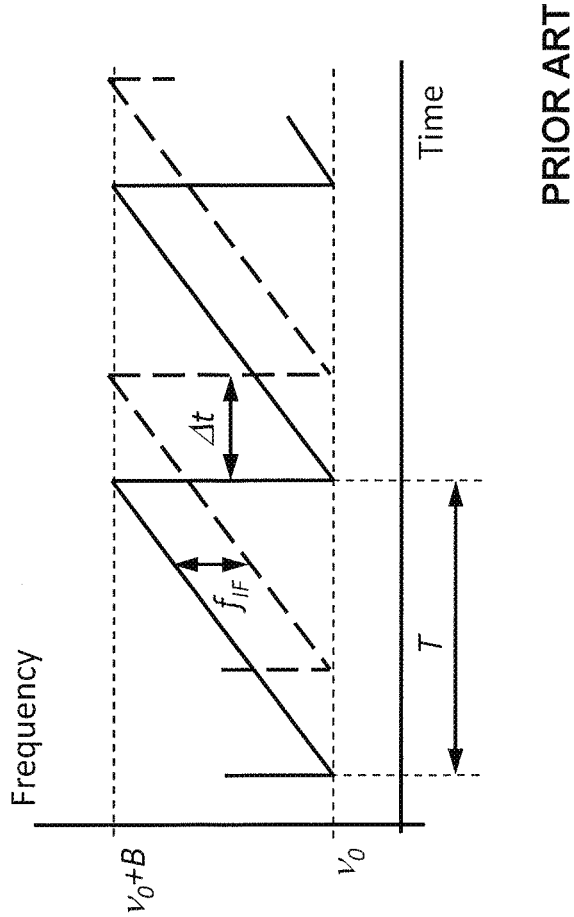
FIG. 1 shows waveforms for a frequency modulation with a ramp modulation function in accordance with the prior art.

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure describes a method and integrated optical circuits for frequency-modulated continuous-wave (FMCW) lidar for range and directional velocity measurement. A dual frequency laser is used. The radiation of one frequency of the dual frequency laser is used as a reference radiation and mixed at a photodetector (PD) with radiation of the other frequency of the dual frequency laser, which is scattered or reflected from a remote object. The mixed signal is a beat frequency which is detected by a photodetector (PD) for spectral measurement to derive the range and directional velocity of the object. Velocity here may be a vector that includes the speed and the direction of the object being measured.

The method provides a large spectral displacement of a beat frequency from 0 Hz, which desirable for measurements of range and velocity of objects. In the present disclosure, the spectral displacement is accomplished without the use of any electronic or electro-optic devices/modulators, which simplifies the lidar and reduces the noise in the measurements. An even more important advantage of this method is that by using two frequencies from the same laser for FMCW lidar, an unambiguous measurement of velocity may be obtained because of the real frequency shift from 0 Hz of the beat frequency at the photodetector (PD). Usually such a shift is provided by application of electronic or electro-optic modulators and results in generation of two sidebands symmetrically positioned relative to the central frequency of radiation. These symmetrical sidebands do not allow unambiguous measurement of velocity.

To summarize, the present disclosure provides a large spectral shift of the beat frequency on a photodetector (PD), makes possible unambiguous measurement of object velocity, and does not require application of any electronic or electro-optic devices/modulators. Therefore, the present disclosure allows accurate spectral measurements resulting in reliable derivation of range and velocity. An additional advantage is that the progress in semiconductor lasers during the last decade allows integrated photonic devices implementing the method to have a very small size and weight.

The standard FMCW method for range and velocity measurements is presented here. In the following, optical frequency is denoted by $\nu$ and frequencies below 100 GHz are denoted by f. Usually, for FMCW measurements a narrowband laser is used. Its frequency $\nu_0$ varies linearly with time. In the case of a semiconductor laser variation in frequency is provided by current modulation. By linearly varying the current a linearly chirp frequency $\nu_m = \nu_0 + Bt/T$, is generated, where B is the bandwidth or range of frequency modulation, T is the period of frequency sweeping, and t is time.

The chirp frequency is generally split into two signals. For example, a lower power radiation may be used as a reference signal and a higher power radiation may be used for exposure of a remote object. When the radiation is reflected or scattered from the object, the reflected or scattered radiation is delayed by $\Delta t = 2L/c$, where L is the distance to the object and c is the speed of the light. Such a delay results in a frequency shift usually named as intermediate frequency $f_{IF}$, as shown in FIG. 1. This shift is linearly depended on time delay $$f_{IF} = \frac{B \Delta t}{T}$$

$$\Delta t = \frac{T f_{IF}}{B} = \frac{2L}{c}$$

and from this $$L = \frac{c T f_{IF}}{2B}.$$

Thus, the range or distance to the object can be calculated if the frequency shift is known. To measure this shift, the delayed signal is mixed with a reference signal on a photodetector (PD).

Let's consider reference and signal optical fields incident on the PD:

$$E_{ref} = A_{ref} e^{i[2\pi\nu_m t + \varphi_{ref}(t)]}$$

$$E_{sig} = A_{sig} e^{i[2\pi(\nu_m - f_{IF})t + \varphi_{sig}(t)]}$$

where $|E_{ref}|^2 = A_{ref}^2$ and $|E_{sig}|^2 = A_{sig}^2$ are optical powers and $\varphi_{ref}(t)$ and $\varphi_{sig}(t)$ are phases of radiations. The total field at the PD is then equal to $E_{ref} + E_{sig}$. Therefore, the photocurrent i(t) generated at the PD with responsivity $\mathcal{R}$ is:

$$i(t) = \mathcal{R}\{(A_{sig} e^{i[2\pi(\nu_m - f_{IF})t + \varphi_{sig}(t)]} + A_{ref} e^{i[2\pi\nu_m t + \varphi_{ref}(t)]}) \times$$

$$\times (A_{sig} e^{-i[2\pi(\nu_m - f_{IF})t + \varphi_{sig}(t)]} + A_{ref} e^{-i[2\pi\nu_m t + \varphi_{ref}(t)]})\}$$

$$i(t) = \mathcal{R}\{A_{sig}^2 + A_{ref}^2 + A_{sig} A_{ref} (e^{i[2\pi f_{IF} t + \Delta\varphi(t)]} + e^{-i[2\pi f_{IF} t + \Delta\varphi(t)]})\}$$

$$i(t) = \mathcal{R}\{A_{sig}^2 + A_{ref}^2 + 2 A_{sig} A_{ref} \cos(2\pi f_{IF} t + \Delta\varphi(t))\} \quad (1)$$

where $$\Delta\varphi(t) = \varphi_{sig}(t) - \varphi_{ref}(t)$$

One can see from Equation (1) that the photocurrent i(t) is not depended on any optical frequency. Its variable component depends only on intermediate microwave frequency $f_{IF}$ which can be measured by current photodetectors.

If the object has a radial speed, this will result in a Doppler shift of the returned frequency with the value of $f_D=(2V/c)\nu_0$ where V is the speed of the object. The returned frequency is the dashed line in FIG. 1. One can find that in this case the photocurrent generated at the PD is $$i(t)=\mathcal{R}\{A_{sig}^2+A_{ref}^2+2A_{sig}A_{ref}\cos(2\pi(f_{IF}\pm f_D)t+\Delta\varphi(t))\}$$

where the sign of $f_D$ depends on the direction of the object. Periodic measurements of the frequency shift $f_{IF}\pm f_D$ allow calculations of range/distance dependence vs time to determine the velocity of object. If values of the frequency shift are small, the measurements may suffer from high noise around 0 Hz. One possible way to overcome this circumstance is to displace the beat signal $f_{IF}\pm f_D$ from 0 Hz. Usually, electronic or electro-optic modulators are used for this displacement. However, these modulators develop two frequency sidebands as was mentioned above and do not allow defining the sign of Doppler shift or unambiguous measurement of velocity.

Figure 2:
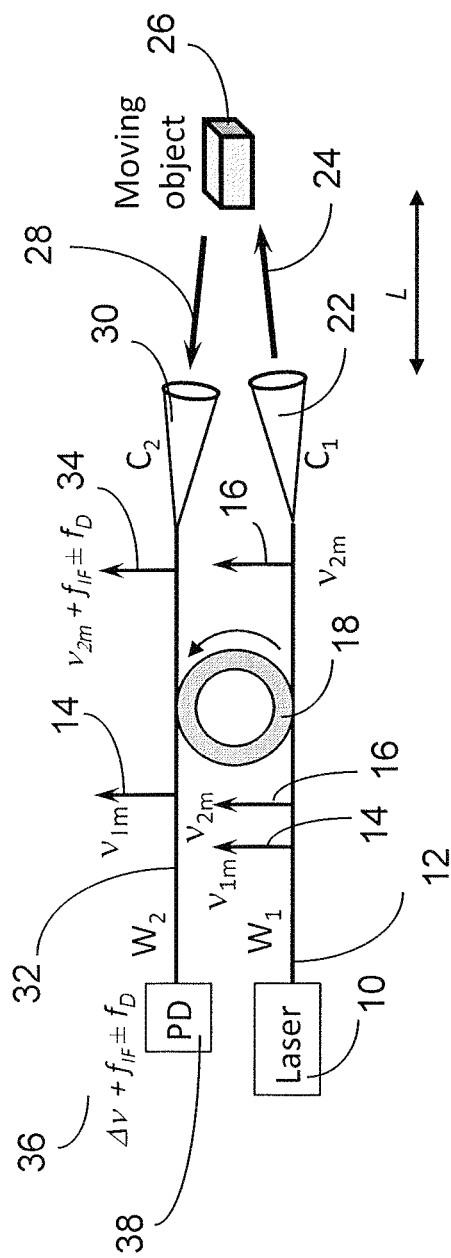
FIG. 2 shows a dual frequency FMCW lidar in accordance with the present disclosure.

FIG. 2 shows a dual frequency FMCW lidar in accordance with the present disclosure. Here, the frequencies $\nu_1$ and $\nu_2$ of laser radiation vary linearly with time by current modulation of a laser 10, which may be a semiconductor laser. These radiations with linearly chirp frequencies $\nu_{1m}=\nu_1+Bt/T$ 14 and $\nu_{2m}=\nu_2+Bt/T$ 16 are transmitted by the laser 10 to waveguide $W_1$ 12. The radiation of frequency $\nu_{1m}$ 14 from laser 10 is coupled to a narrow bandpass filter 18, which has a passband arranged to couple and pass $\nu_{1m}$ 14 through the narrow bandpass filter 18 and into waveguide $W_2$ 32. The narrow bandpass filter 18 may be an optical microresonator, a microring resonator, a plurality of mutually coupled ring resonators, or a plurality of coupling microresonators. The radiation of frequency $\nu_{2m}$ 16 from laser 10 does not couple to the narrow bandpass filter 18 to waveguide $W_2$ 32, instead $\nu_{2m}$ 16 continues on waveguide $W_1$ 12 to collimator $C_1$ 22, and illuminates the object 26, whose velocity is to be measured.

Then, the radiation scattered from the object 26 moving with velocity ±V along the direction of measurement is received at collimator $C_2$ 30 and coupled to waveguide $W_2$ 32. The central frequency $\nu_{2m}$ 16 of the received radiation acquires the Doppler shift $+f_D=(2V/c)\nu_{2m}$ or $-f_D=(2V/c)\nu_{2m}$ depending on object velocity direction and the intermediate frequency $f_{IF}$ which depends linearly on the distance L to the object as discussed above. Therefore, the received spectral line is $\nu_{2m}+f_{IF}\pm f_D$ 34, which does not couple to the narrow bandpass filter 18, and passes to photodetector (PD) 38 where $\nu_{2m}+f_{IF}\pm f_D$ 34 is mixed with the reference radiation of frequency $\nu_{1m}$ 14, which produces the beat frequency $\Delta\nu+f_{IF}\pm f_D$, 36, where $\Delta\nu=\nu_{1m}-\nu_{2m}$ is a known and constant value. This provides a large displacement of the beat frequency by $\nu_1-\nu_2$ from 0 Hz. The amount of the displacement from 0 Hz depends on the design of the laser cavity and allows measurement of the Doppler shift sign to provide an unambiguous measurement of the direction of the object velocity. An electronic or electro-optic modulator is not required, so much more accurate measurements can be obtained in comparison with the prior art.

Figure 3:
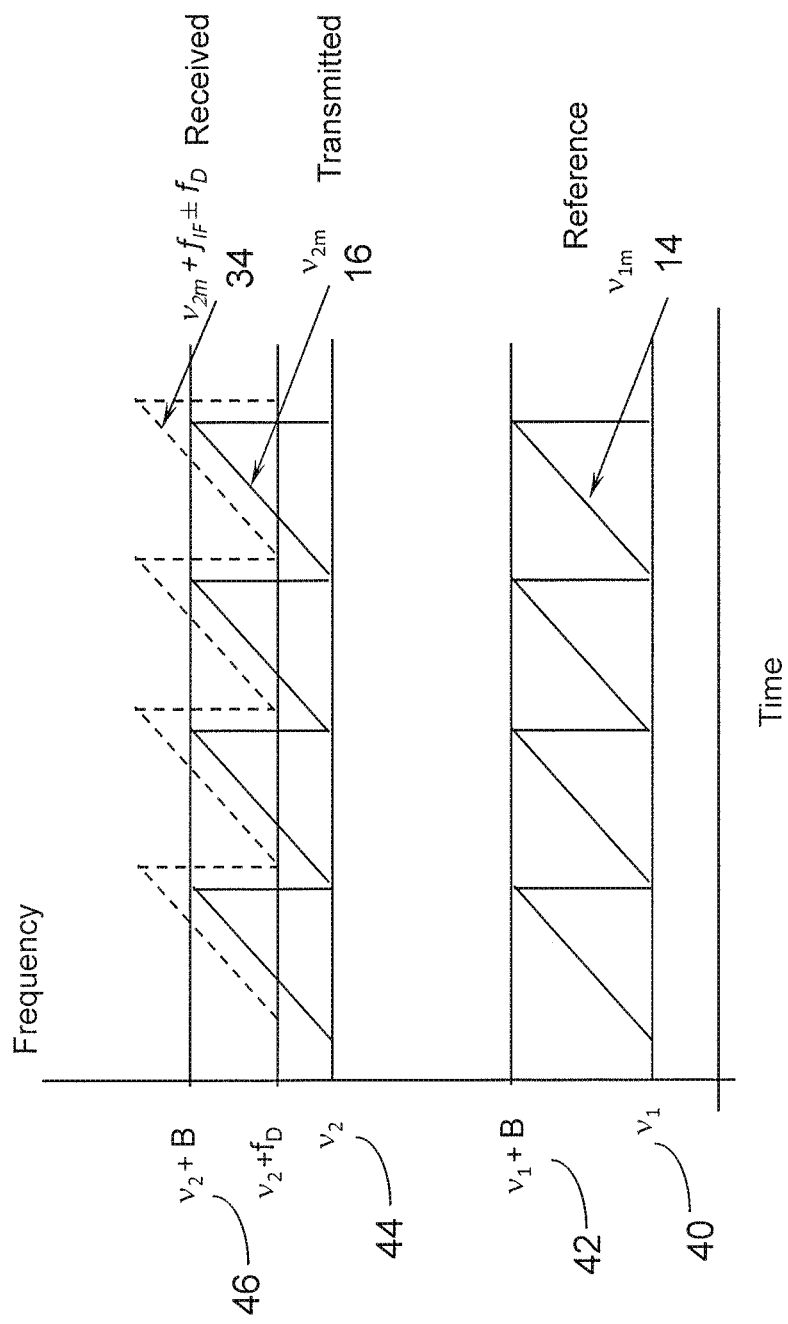
FIG. 3 shows reference, transmitted and received FMCW waveforms in accordance with the present disclosure.

FIG. 3 shows the reference, transmitted, and received linearly chirped ramp waveforms. In this diagram both transmitted beams from laser 10 with frequency $\nu_1$ 40 and $\nu_2$ 44 have the same modulation bandwidth B because both frequencies are the adjacent longitudinal modes of the same semiconductor laser 10 with a modulated current. FIG. 3 shows $\nu_{1m}$ 14 varying between $\nu_1$ 40 and $\nu_1$+B 42. FIG. 3 also shows $\nu_{2m}$ 16 varying between $\nu_2$ 44 and $\nu_2$+B 46, and shows the received waveform $\nu_{2m}+f_{IF}\pm f_D$ 34. Unlike a standard homodyne configuration, the reference radiation of frequency $\nu_{1m}$ 14 is mixed at the PD with the time delayed radiation of the Doppler shifted frequency $\nu_{2m}+f_{IF}\pm f_D$ 34 producing a time varying intermediate frequency $\Delta\nu+f_{IF}\pm f_D$ 36, where $\Delta\nu=\nu_{1m}-\nu_{2m}$, which can used to calculate both the range and velocity of the object as in the standard FMCW method described above.

It is known that frequency separation $\Delta\nu_L$ between any two adjacent laser modes of a laser 10 is equal to $c/(2nL_c)$, where c is the speed of light, n is the refractive index of the cavity material, and $L_c$ is the cavity length. Therefore, any laser with an optical length of cavity $nL_c>5$ mm, for example, will provide a frequency displacement $\Delta\nu=\nu_{1m}-\nu_{2m}$ of equal to or less than 30 GHz. Such a large displacement is more than enough for spectral displacement of the Doppler shifted line from 0 Hz. The displacement is a one sided frequency shift and allows directional measurement of object speed.

The modulation bandwidths B of the two adjacent laser frequencies may have a small difference. This difference can modulate the frequency separation between the two adjacent longitudinal modes of the laser 10 and may influence the accuracy of measurements. As described above, this separation $\Delta\nu_L$ is equal to $c/(2nL_c)$. Thus, $$\frac{\delta(\Delta\nu_L)}{\Delta\nu_L}=-\frac{\Delta(nL_c)}{(nL_c)}\cong -\frac{\Delta\lambda}{\lambda}=\frac{\Delta\nu}{\nu}=\frac{B}{\nu}$$

where $\lambda$ and $\nu$ are the wavelength and frequency of the laser. The modulation bandwidth B is usually of order of a few gigahertz or less and the laser frequency may be typically about $2\cdot10^{14}$ Hz, or about 1.55 μm in wavelength. Therefore, the frequency separation between two adjacent longitudinal modes with $\Delta\nu_L$ of about a few GHz may be changed by current modulation to tens of kHz or less, which is a negligible value.

The single optical microresonator 18, shown in FIG. 2, may have a rather narrow Lorentzian transmission shape. If a transmission linewidth of this filter is comparable with the modulation bandwidth B, this can result in the amplitude modulation of the beam $\nu_{1m}$ 14 coupled to a narrow bandpass filter 18 and passed through this filter 18 into waveguide $W_2$ 32. This modulation can develop sidebands and reduce the measurement accuracy. Therefore, it is necessary to use a broad enough transmission linewidth of the filter to exclude such a modulation. Also higher order filters, which are multiple mutually coupled ring resonators, may be used. Higher order filters have a much steeper roll-off and a flatter passband, as described in Reference [4] and [5], which are incorporated herein by reference. The use of such higher order filters is a preferred embodiment.

Figure 4:
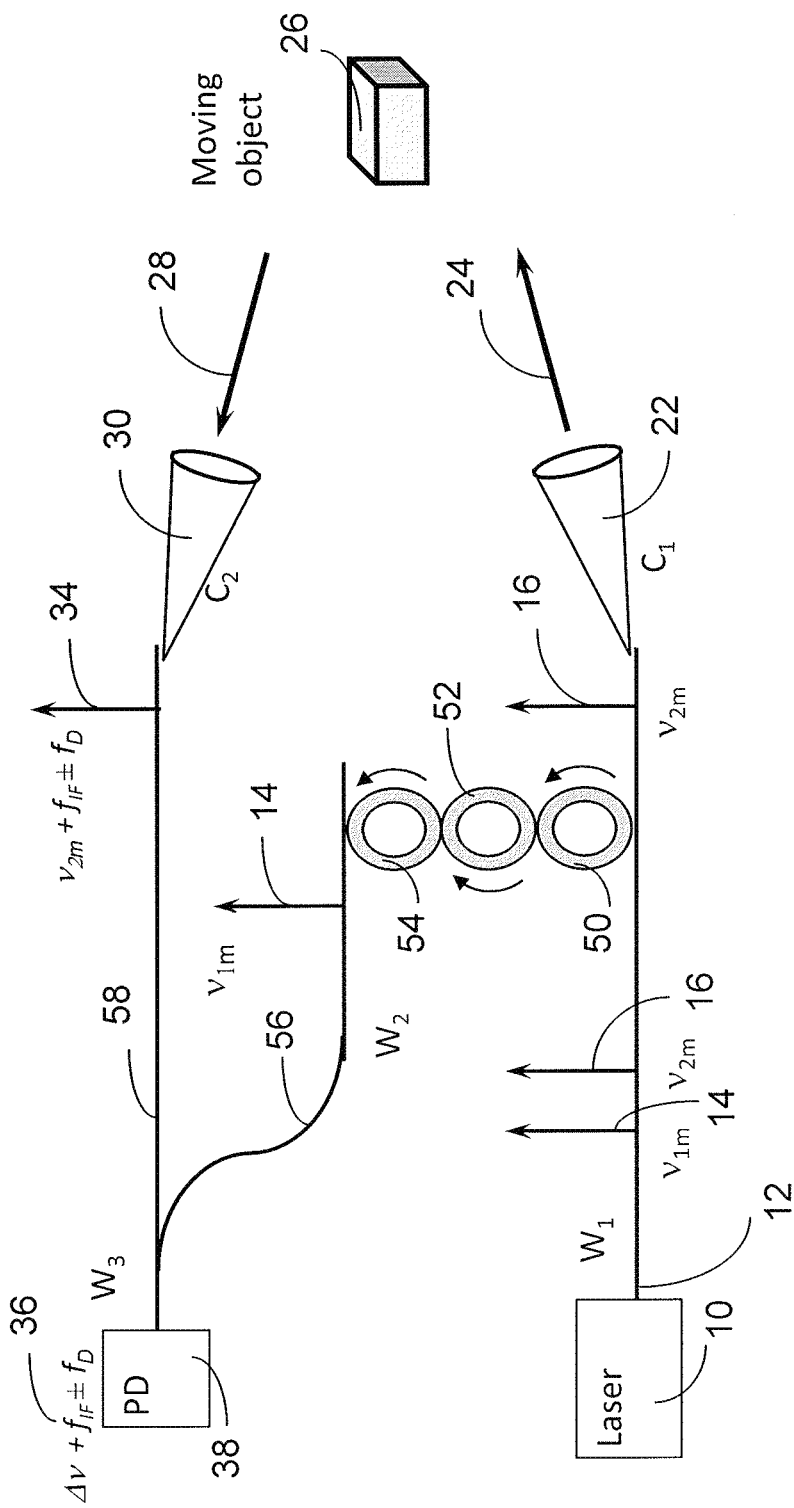
FIG. 4 shows another embodiment of a dual frequency FMCW lidar in accordance with the present disclosure.

Different modifications of the embodiment shown in FIG. 2 can be developed. For instance, the received scattered radiation $\nu_{2m}\pm f_D$ 34 can be coupled into a separate waveguide $W_3$ 58, as shown in FIG. 4, which is coupled directly to the photodetector (PD) 38. In this embodiment, the scattered radiation $\nu_{2m}\pm f_D$ 34 does not ever pass through the narrow bandpass filter 18, which reduces any possible losses in the received signal, as compared to the embodiment of FIG. 2 in which the $\nu_{2m}\pm f_D$ 34 does pass through the narrow bandpass filter 18.

FIG. 4 shows three coupled microresonators 50, 52 and 54, which may be used to improve the bandpass characteristics of the narrow bandpass filter 18 and to increase out-of-band signal rejection as described in References [4] and [5], which are incorporated herein by reference. However, the embodiment of FIG. 4, with $v_{2m}+f_{IF}\pm f_D$ 34 coupled into a separate waveguide $W_3$ 58, may use any narrow passband filter 18, such as the one described with reference to FIG. 2.

The radiation of frequency $v_{1m}$ 14 from laser 10 is coupled to the three coupled microresonators 50, 52 and 54, which together have a passband arranged to couple and pass $v_{1m}$ 14 through to waveguide $W_2$ 56. The radiation of frequency $v_{2m}$ 16 from laser 10 does not couple to the microresonators 50, 52 and 54 and instead $v_{2m}$ 16 continues on waveguide $W_1$ 12 to collimator $C_1$ 22, and illuminates the object 26, whose velocity is to be measured.

Then, the radiation scattered from the object 26 moving with velocity $\pm V$ along the direction of measurement, $v_{2m}+f_{IF}\pm f_D$ 34, is received at collimator $C_2$ 30 and coupled to waveguide $W_3$ 58, as described above. Then $v_{2m}+f_{IF}\pm f_D$ 34 on $W_3$ 58 is mixed at photodetector (PD) 38 with the reference radiation of frequency $v_{1m}$ 14 on $W_2$ 56 developing the beat frequency $\Delta v+f_{IF}\pm f_D$ 36, where $\Delta v = v_{1m}-v_{2m}$, which provides a large displacement by $v_1-v_2$ of the beat frequency from 0 Hz. Waveguide $W_2$ 56 and waveguide $W_3$ 58 may be merged and then coupled to the photodetector 38 or separately coupled to the photodetector 38 by using a standard well-known technique of free space beam combining with beamsplitter. However, when the beams are coupled to the photodetector in free space, the beams must be well collimated and absolutely parallel to each other for efficient development of beat frequency $f_{IF}$.

Any laser 10 with a cavity design which results in a desired longitudinal mode separation can be used. The progress in semiconductor lasers in the last decade has resulted in development of small-sized high power lasers which can be directly used in integrated optical circuits. Therefore, the application of semiconductor lasers in the proposed method is preferable.

For operation of the method, it is not necessary to use a laser 10 having only two frequencies. A laser 10 having more than two longitudinal modes can be used in the method. Moreover, lasers having one powerful longitudinal mode and one or more weak longitudinal modes may be used. The most powerful longitudinal mode may be used for transmission to the object and any adjacent weak mode having 10 or even 100 times a lower intensity than the most powerful longitudinal mode may be used as a reference radiation.

The laser 10 may be a laser diode, a quantum cascade laser, or an optical fiber laser. Such lasers can be developed by application of well-known techniques by proper design of periodic structures like distributed feedback Bragg (DFB) gratings over the active region of lasers or distributed Bragg reflectors (DBR) as one of the laser mirrors. Another narrowband reflector which can be used as a mirror for spectral design of any laser is a volume Bragg grating (VBG).

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A lidar comprising:

a laser having a first frequency-modulated laser radiation and a second frequency-modulated laser radiation;

a first waveguide coupled to the laser, wherein the first frequency-modulated laser radiation and the second frequency-modul-ated laser radiation are transmitted by the laser into the first waveguide;

a second waveguide;

a filter coupled between the first waveguide and the second waveguide, wherein the filter is configured to couple and pass the first frequency-modulated laser radiation through the filter to the second waveguide, and is configured to not couple or pass the second frequency-modulated laser radiation through the filter to the second waveguide; and a photodetector coupled to the second waveguide;

wherein the first frequency-modulated laser radiation comprises a linearly chirped ramp modulation $v_{1m}$;

wherein the second frequency-modulated laser radiation comprises a linearly chirped ramp modulation $v_{2m}$;

wherein a waveform received by the second waveguide comprises a scattered radiation of $v_{2m}$ from an object shifted by a Doppler shift $f_D$ caused by a velocity of the object so that the received waveform is $v_{2m}+f_{IF}\pm f_D$; and wherein the photodetector mixes the linearly chirped ramp modulation $v_{1m}$ with the received waveform $v_{2m}+f_{IF}\pm f_D$ to produce a beat frequency $\Delta v+f_{IF}\pm f_D$, where $\Delta v = v_{1m}-v_{2m}$;

where $$f_{IF} = \frac{B\Delta t}{T},$$

$\Delta t = 2L/c$,

L is a distance to the object,
c is a speed of the light,
B is a bandwidth or range of frequency modulation,
T is a period of frequency sweeping; and $$L = \frac{cTf_{IF}}{2B}.$$

2. The lidar of claim 1 further comprising:
a first collimator coupled to the first waveguide; and
a second collimator coupled to the second waveguide.
3. The lidar of claim 1 wherein:
the laser has at least two longitudinal modes.
4. The lidar of claim 1 wherein:
the laser comprises a semiconductor laser, a laser diode, a quantum cascade laser, or an optical fiber laser.
5. The lidar of claim 1:
wherein $\Delta v = v_{1m} - v_{2m}$ is equal to $c/(2nL_c)$, where c is a speed of light, n is a refractive index of a cavity material of the laser, and $L_c$ is a cavity length of the laser.
6. The lidar of claim 5:
wherein an optical length of the cavity $nL_c$ is greater than 5 mm, so that $\Delta v = v_{1m} - v_{2m}$ is equal to or less than 30 GHz.
7. The lidar of claim 1 wherein:
the filter comprises an optical microresonator, a microring resonator, a plurality of mutually coupled ring resonators, or a plurality of coupling microresonators.
8. The lidar of claim 1:
wherein the waveform received by the second waveguide comprises a scattered radiation from an object shifted by a Doppler shift caused by a velocity of the object; and
wherein the photodetector mixes the first frequency-modulated laser radiation with a waveform received by the second waveguide to produce a beat frequency.
9. A method of frequency-modulated continuous-wave (FMCW) detection of range and velocity of an object comprising:
transmission of a first frequency-modulated laser radiation from a laser and a second frequency-modulated laser radiation from the laser through a first waveguide;
redirection by a filter of the first frequency-modulated laser radiation into a second waveguide;
outcoupling the second frequency-modulated laser radiation from the first waveguide for exposure of an object;
coupling a received waveform of scattered radiation from the object into the second waveguide; and
mixing the received scattered radiation with the first frequency-modulated laser radiation;
wherein the first frequency-modulated laser radiation comprises a linearly chirped ramp modulation $v_{1m}$;
wherein the second frequency-modulated laser radiation comprises a linearly chirped ramp modulation $v_{2m}$;
wherein a waveform received by the second waveguide comprises a scattered radiation of $v_{2m}$ from an object shifted by a Doppler shift $f_D$ caused by a velocity of the object so that the received waveform is $v_{2m} + f_{IF} \pm f_D$; and
wherein the photodetector mixes the linearly chirped ramp modulation $v_{1m}$ with the received waveform $v_{2m} + f_{IF} \pm f_D$ to produce a beat frequency $\Delta v + f_{IF} \pm f_D$, where $\Delta v = v_{1m} - v_{2m}$;
where $$f_{IF} = \frac{B\Delta t}{T},$$

$\Delta t = 2L/c$,

L is a distance to the object,
c is a speed of the light,
B is a bandwidth or range of frequency modulation,
T is a period of frequency sweeping; and $$L = \frac{cTf_{IF}}{2B}.$$

10. The method of claim 9:
wherein $\Delta v = v_{1m} - v_{2m}$ is equal to $c/(2nL_c)$, where c is a speed of light, n is a refractive index of a cavity material of the laser, and $L_c$ is a cavity length of the laser.
11. The method of claim 10:
wherein an optical length of the cavity $nL_c$ is greater than 5 mm, so that $\Delta v = v_{1m} - v_{2m}$ is equal to or less than 30 GHz.
12. The method of claim 9 further comprising:
determining the velocity of the object by making periodic measurements of $f_{IF} \pm f_D$.
13. The method of claim 9 further comprising:
spectral measurement of a beat frequency from the mixed received scattered radiation and the first frequency-modulated laser radiation; and
derivation of range and velocity of the object.
14. The method of claim 9 wherein:
the laser comprises a semiconductor laser, a laser diode, a quantum cascade laser, or an optical fiber laser.
15. The method of claim 9 wherein:
the filter comprises an optical microresonator, a microring resonator, a plurality of mutually coupled ring resonators, or a plurality of coupling microresonators.
16. The method of claim 9:
wherein the received scattered radiation comprises a Doppler shift caused by a velocity of the object; and
wherein a photodetector mixes the received scattered radiation with the first frequency-modulated laser radiation to produce a beat frequency.
17. A lidar comprising:
a laser having a first frequency-modulated laser radiation and a second frequency-modulated laser radiation;
a first waveguide coupled to the laser, wherein the first frequency-modulated laser radiation and the second frequency-modulated laser radiation are transmitted by the laser into the first waveguide;
a second waveguide;
a filter coupled between the first waveguide and the second waveguide, wherein the filter is configured to couple and pass the first frequency-modulated laser radiation through the filter to the second waveguide, and is configured to not couple or pass the second frequency-modulated laser radiation through the filter to the second waveguide;

a third waveguide; and a photodetector coupled to the second waveguide and to the third waveguide;

wherein the first frequency-modulated laser radiation comprises a linearly chirped ramp modulation $v_{1m}$;

wherein the second frequency-modulated laser radiation comprises a linearly chirped ramp modulation $v_{2m}$;

wherein a waveform received by the third waveguide comprises a scattered radiation of $v_{2m}$ from an object shifted by a Doppler shift $f_D$ caused by a velocity of the object so that the received waveform is $v_{2m}+f_{IF}\pm f_D$; and wherein the photodetector mixes the linearly chirped ramp modulation $v_{1m}$ with the received waveform on the third waveguide $v_{2m}+f_{IF}+f_D$ to produce a beat frequency $\Delta v+f_{IF}\pm f_D$, where $\Delta v=v_{1m}-v_{2m}$;

where $$f_{IF} = \frac{B\Delta t}{T},$$

$\Delta t = 2L/c$,

L is a distance to the object, c is a speed of the light,

B is a bandwidth or range of frequency modulation,

T is a period of frequency sweeping; and $$L = \frac{cTf_{IF}}{2B}.$$

18. The lidar of claim 17 further comprising:
a first collimator coupled to the first waveguide; and
a second collimator coupled to the third waveguide.

19. The lidar of claim 17 wherein:
the laser has at least two longitudinal modes.

20. The lidar of claim 17 wherein:
the laser comprises a semiconductor laser, a laser diode, a quantum cascade laser, or an optical fiber laser.

21. The lidar of claim 17:
wherein $\Delta v=v_{1m}-v_{2m}$ is equal to $c/(2nL_c)$, where c is a speed of light, n is a refractive index of a cavity material of the laser, and $L_c$ is a cavity length of the laser.

22. The lidar of claim 21:
wherein an optical length of the cavity $nL_c$ is greater than 5 mm, so that $\Delta v=v_{1m}-v_{2m}$ is equal to or less than 30 GHz.

23. The lidar of claim 17 wherein:
the filter comprises an optical microresonator, a microring resonator, a plurality of mutually coupled ring resonators, or a plurality of coupling microresonators.

24. The lidar of claim 17:
wherein the waveform received by the third waveguide comprises a scattered radiation from an object shifted by a Doppler shift caused by a velocity of the object; and wherein the photodetector mixes the first frequency-modulated laser radiation with a waveform received by the second waveguide to produce a beat frequency.

* * * * *